(12) United States Patent
Weber et al.

(10) Patent No.: US 12,349,401 B2
(45) Date of Patent: Jul. 1, 2025

(54) SEMICONDUCTOR DEVICE INCLUDING A TRENCH STRUCTURE HAVING A TRENCH DIELECTRIC STRUCTURE WITH A GAP

(71) Applicant: Infineon Technologies Austria AG, Villach (AT)

(72) Inventors: Hans Weber, Bayern (DE); David Kammerlander, Villach (AT); Andreas Riegler, Lichtpold (AT)

(73) Assignee: Infineon Technologies Austria AG, Villach (AT)

( * ) Notice: Subject to any disclaimer, the term of this patent is extended or adjusted under 35 U.S.C. 154(b) by 437 days.

(21) Appl. No.: 17/695,207

(22) Filed: Mar. 15, 2022

(65) Prior Publication Data
US 2022/0310838 A1 Sep. 29, 2022

(30) Foreign Application Priority Data
Mar. 23, 2021 (EP) .................................. 21164244

(51) Int. Cl.
*H10D 30/66* (2025.01)
*H10D 64/00* (2025.01)
*H10D 64/27* (2025.01)

(52) U.S. Cl.
CPC ......... *H10D 30/668* (2025.01); *H10D 64/112* (2025.01); *H10D 64/514* (2025.01)

(58) Field of Classification Search
CPC ............... H01L 29/7813; H01L 29/404; H01L 29/42364; H01L 29/1608; H01L 29/41766; H01L 29/0649; H01L 29/42376; H01L 29/4991; H01L 29/7397; H01L 29/407; H01L 29/4236; H01L 29/42368; H01L 29/515
USPC ........................................................ 257/330
See application file for complete search history.

(56) References Cited

U.S. PATENT DOCUMENTS

| 10,304,933 B1 | 5/2019 | Woo et al. | |
| 2006/0273385 A1* | 12/2006 | Hshieh | H10D 30/0295 438/270 |
| 2007/0215920 A1* | 9/2007 | Zundel | H01L 29/7816 257/288 |
| 2009/0114986 A1 | 5/2009 | Hirler et al. | |

(Continued)

FOREIGN PATENT DOCUMENTS

| DE | 10014660 A1 | 10/2001 |
| DE | 102016108949 A1 | 11/2017 |
| DE | 102017101672 A1 | 8/2018 |

*Primary Examiner* — Mohammad M Hoque
(74) *Attorney, Agent, or Firm* — Murphy, Bilak & Homiller, PLLC

(57) ABSTRACT

A semiconductor device is proposed. An example of the semiconductor device includes a semiconductor body having a first main surface. A trench structure extends into the semiconductor body from the first main surface. The trench structure includes a trench electrode structure and a trench dielectric structure. The trench dielectric structure includes a gate dielectric in an upper part of the trench dielectric structure and a gap in a lower part of the trench dielectric structure. The semiconductor device further includes a body region adjoining the gate dielectric at a sidewall of the trench structure in the upper part of the trench dielectric structure. The gate dielectric extends deeper into the semiconductor body along the sidewall than the body region.

15 Claims, 5 Drawing Sheets

(56) References Cited

U.S. PATENT DOCUMENTS

| | | |
|---|---|---|
| 2009/0294843 A1 | 12/2009 | Radic et al. |
| 2010/0264486 A1 | 10/2010 | Denison et al. |
| 2013/0248993 A1* | 9/2013 | Sedlmaier ........... H01L 29/7804 |
| | | 257/334 |
| 2014/0054684 A1* | 2/2014 | Darwish ................ H10D 30/65 |
| | | 257/329 |
| 2014/0225186 A1* | 8/2014 | Abou-Khalil ........ H10D 30/024 |
| | | 438/424 |
| 2017/0263767 A1* | 9/2017 | Nishiwaki ......... H01L 29/66734 |
| 2020/0083335 A1 | 3/2020 | Leomant et al. |
| 2022/0302266 A1* | 9/2022 | Kachi ................ H01L 29/0649 |

* cited by examiner

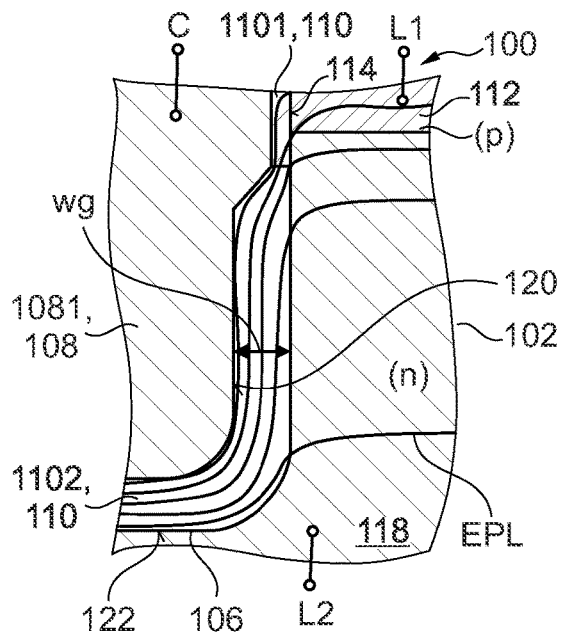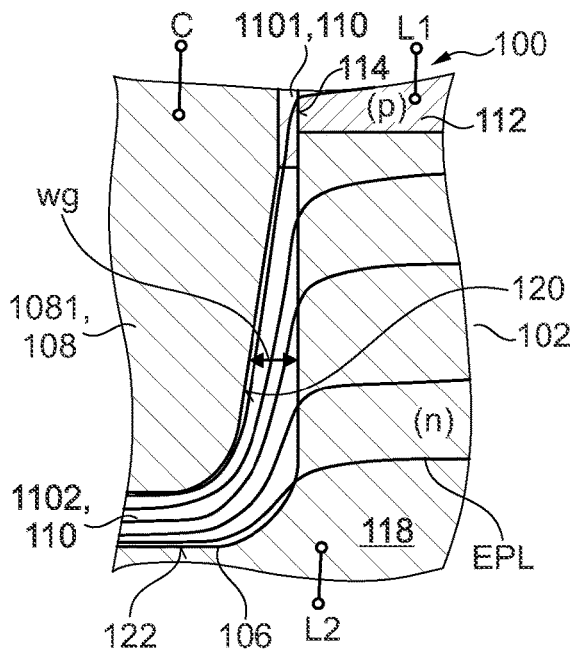
Fig. 4A    Fig. 4B
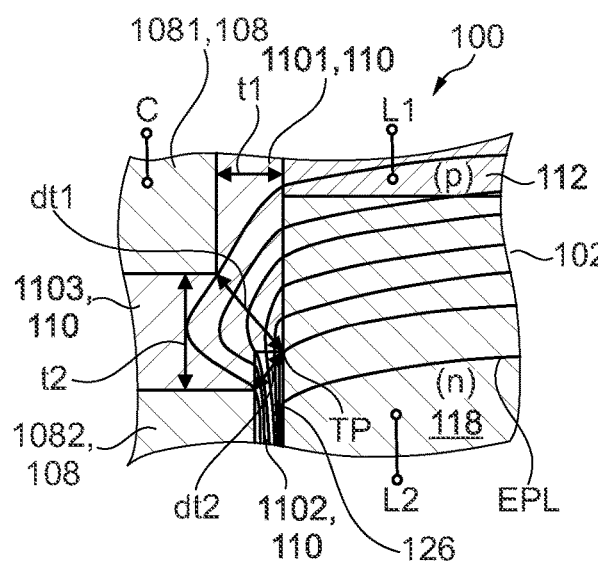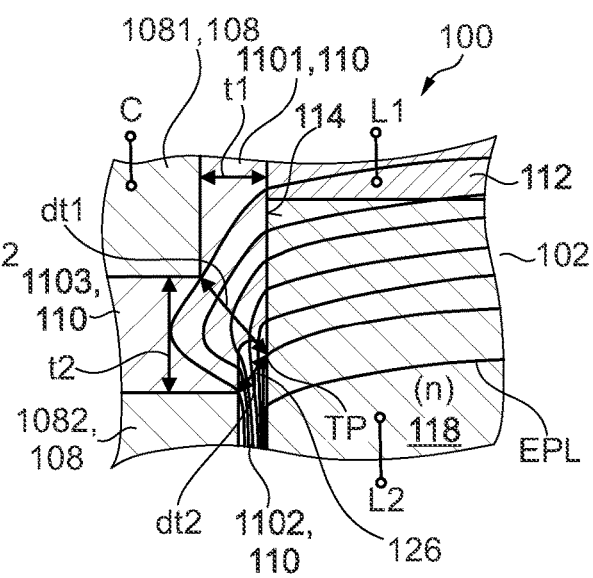
Fig. 5A    Fig. 5B

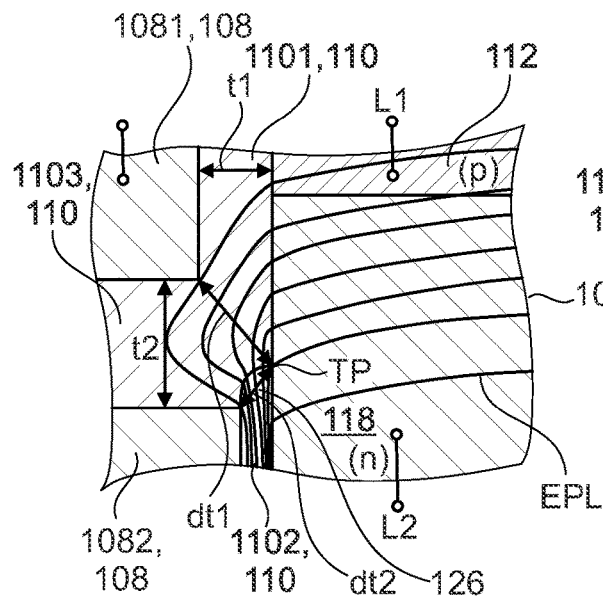
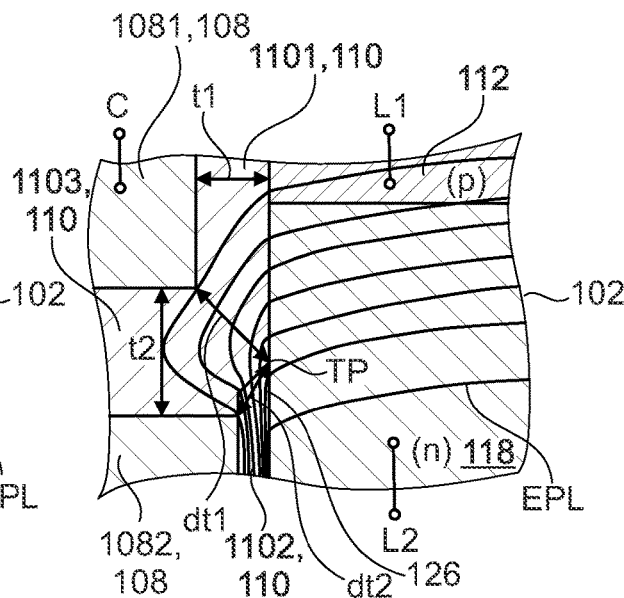
Fig. 5C     Fig. 5D
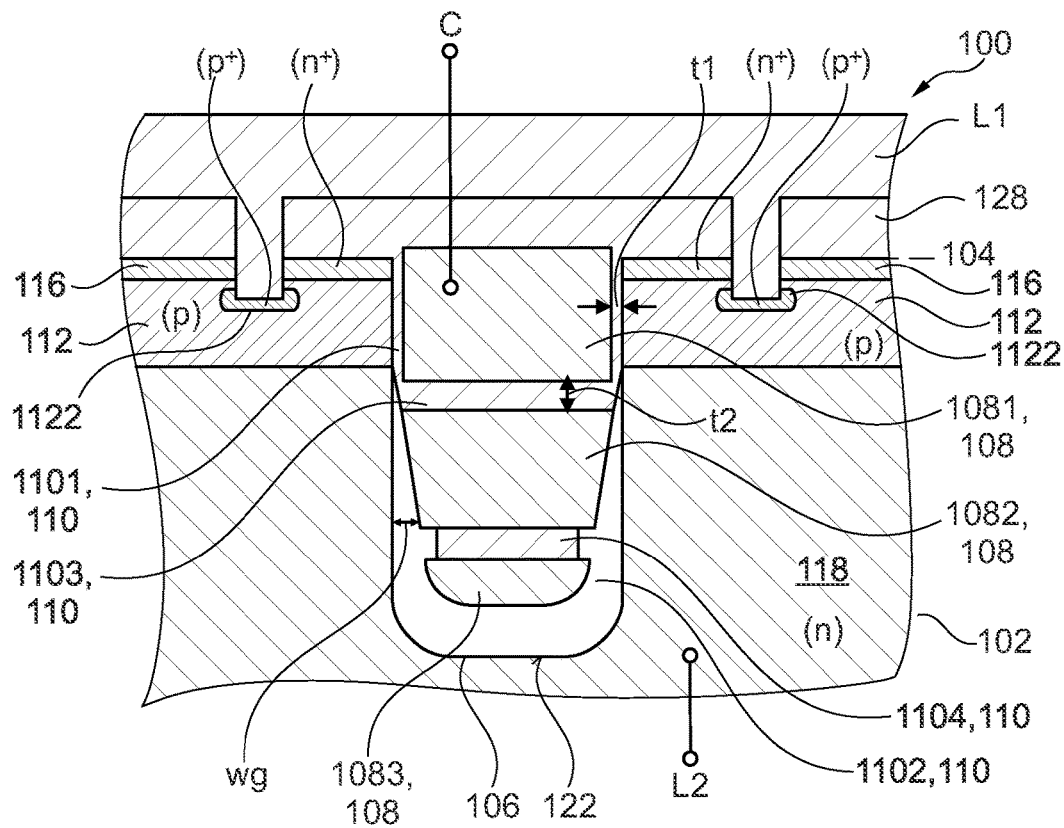
Fig. 6

SEMICONDUCTOR DEVICE INCLUDING A TRENCH STRUCTURE HAVING A TRENCH DIELECTRIC STRUCTURE WITH A GAP

TECHNICAL FIELD

The present disclosure is related to a semiconductor device, in particular to a semiconductor device including a trench structure.

BACKGROUND

Technology development of new generations of semiconductor devices, e.g. insulated gate field effect transistors (IGFETs) such as metal oxide semiconductor field effect transistors (MOSFETs) or insulated gate bipolar transistors (IGBTs), aims at improving electric device characteristics and reducing costs by shrinking device geometries. Although costs may be reduced by shrinking device geometries, a variety of tradeoffs and challenges have to be met when increasing device functionalities per unit area. For example, shrinking of device geometries may be accompanied by challenges for meeting demands on device reliability that may be caused by high electric fields in trench dielectrics.

There may be a desire for improved concepts for semiconductor devices.

SUMMARY

An example of the present disclosure relates to a semiconductor device. The semiconductor device includes a semiconductor body having a first main surface. The semiconductor device further includes a trench structure extending into the semiconductor body from the first main surface. The trench structure further includes a trench electrode structure and a trench dielectric structure. The trench dielectric structure includes a gate dielectric in an upper part of the trench dielectric structure and a gap in a lower part of the trench dielectric structure. The semiconductor device further includes a body region adjoining the gate dielectric at a sidewall of the trench structure in the upper part of the trench dielectric structure. The gate dielectric extends deeper into the semiconductor body along the sidewall than the body region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of semiconductor devices and together with the description serve to explain principles of the examples. Further examples are described in the following detailed description and the claims.

FIGS. 4A and 4B and FIGS. 5A to 5D are schematic cross-sectional views for illustrating distributions of electric equipotential lines in the gap of the trench dielectric structures.

FIGS. 6 and 7 are schematic cross-sectional views for illustrating further examples of trench dielectric structures of a semiconductor device, wherein the trench dielectric structure includes a gap.

DETAILED DESCRIPTION

Figure 1:
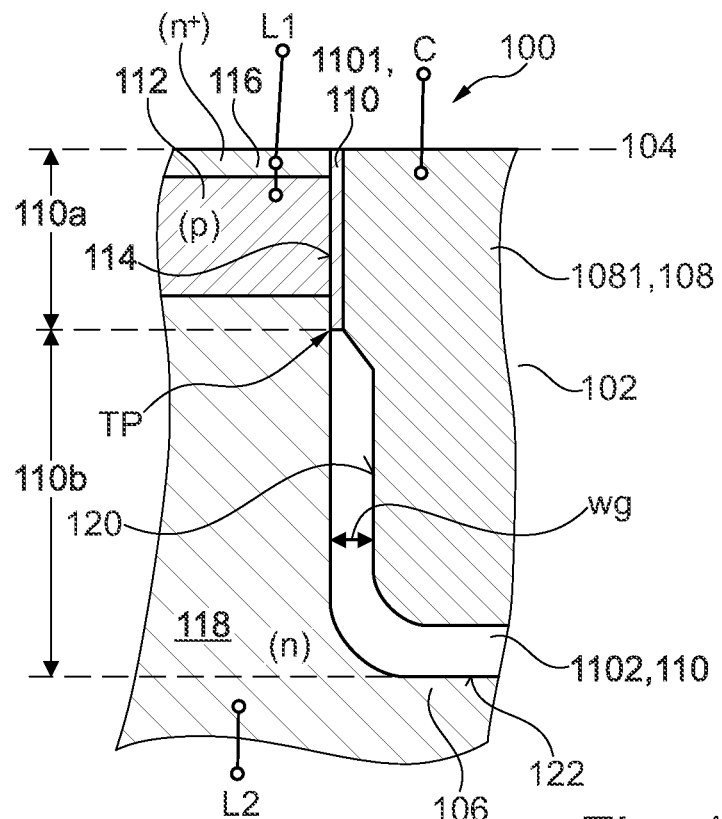
FIGS. 1 to 3 are schematic cross-sectional views for illustrating examples of trench dielectric structures of a semiconductor device, wherein the trench dielectric structure includes a gap in a lower part of the trench dielectric structure.

In the following detailed description, reference is made to the accompanying drawings, which form a part hereof and in which are shown by way of illustrations specific examples in which semiconductor substrates may be processed. It is to be understood that other examples may be utilized and structural or logical changes may be made without departing from the scope of the present disclosure. For example, features illustrated or described for one example can be used on or in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state. An ohmic contact is a non-rectifying electrical junction.

Ranges given for physical dimensions include the boundary values. For example, a range for a parameter y from a to b reads as a≤y≤b. The same holds for ranges with one boundary value like "at most" and "at least".

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

An example of a semiconductor device may include a semiconductor body having a first main surface. The semiconductor device may further include a trench structure extending into the semiconductor body from the first main surface. The trench structure may include a trench electrode structure and a trench dielectric structure. The trench dielectric structure may include a gate dielectric in an upper part of the trench dielectric structure and a gap in a lower part of the trench dielectric structure. The semiconductor device may further include a body region adjoining the gate dielectric at a sidewall of the trench structure in the upper part of the trench dielectric structure. The gate dielectric may extend deeper into the semiconductor body along the sidewall than the body region.

For example, the semiconductor device may be a trench transistor device. The trench transistor device may be an insulated gate field effect transistor (IGFET), e.g. a metal oxide semiconductor field effect transistor (MOSFET). The transistor device may also be an insulated gate bipolar transistor (IGBT), for example.

The semiconductor body may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe).

For example, the semiconductor body may be a crystalline SiC semiconductor substrate. For example, the silicon carbide crystal may have a hexagonal polytype, e.g., 4H or 6H. The silicon carbide semiconductor body may be homogeneously doped or may include differently doped SiC layer portions. The silicon carbide semiconductor body may include one or more layers from another material with a melting point close to or higher than crystalline silicon carbide. For example, the layers from another material may be embedded in the crystalline silicon carbide substrate. The silicon carbide semiconductor substrate may have two essentially parallel main surfaces of the same shape and size and a lateral surface area connecting the edges of the two main surfaces.

For example, the semiconductor device may include transistor cells of a transistor cell array. The transistor cell array may be a 1-dimensional or 2-dimensional regular arrangement of a plurality of transistor cells. For example, the plurality of transistor cells of the transistor cell array may be electrically connected in parallel. For example, source regions of the plurality of transistor cells of an IGFET or IGBT transistor cell array may be electrically connected together. Likewise, drain regions of the plurality of transistor cells of an IGFET transistor cell array may be electrically connected together, or collector regions of the plurality of transistor cells of an IGBT transistor cell array may be electrically connected together. For example, gate electrodes of the plurality of transistor cells of an IGFET or IGBT transistor cell array may be electrically connected together. A transistor cell of the transistor cell array or a part thereof, e.g. the gate electrode, may be designed in the shape of a stripe, a polygon, a circle or an oval, for example.

For example, the semiconductor device may include a first load electrode, e.g. a source (emitter) electrode of an IGFET (IGBT). The first load electrode may be a contact area and be formed by all or part of a wiring layer. For example, the wiring layer may correspond to one wiring level of a wiring area above the first main surface, wherein the one wiring level of the wiring area may be located closest to the first main surface in case of multiple wiring levels. The wiring area may include one or more than one, e.g. two, three, four or even more wiring levels. Each wiring level may be formed by a single one or a stack of conductive layers, e.g. metal layer(s). The wiring levels may be lithographically patterned, for example. Between stacked wiring levels, an interlayer dielectric may be arranged. Contact plug(s) or contact line(s) may be formed in openings in the interlayer dielectric to electrically connect parts, e.g. metal lines or contact areas, of different wiring levels to one another. For example, the contact area of the first load electrode may be electrically connected to a source region of each of the plurality of transistor cells in the semiconductor body by contact plugs arranged between the source region and the contact area of the first load electrode.

Similar to the first load electrode, a second load electrode, e.g. a drain electrode of an IGFET or a collector electrode of an IGBT, may be a contact area and be formed by all or part of another wiring layer. For example, the other wiring layer may correspond to one wiring level of a wiring area above the second main surface. Structural variations of the wiring area and/or the second load electrode over the second main surface may be similar to the structural variations described above with respect to the wiring area and/or the first load electrode.

For example, the trench transistor device may be part of an integrated circuit, or a discrete transistor device. The trench transistor device may be a power trench transistor device, e.g. a vertical power trench transistor device having a load current flow between the first load electrode over the first main surface of the semiconductor body and the second load electrode over the second main surface. In the vertical transistor device, a load current may flow along the vertical direction perpendicular to the first and/or second main surface. The transistor device may be configured to conduct currents of more than 1 A or more than 10 A or even more than 30 A. A number of transistor cells of the transistor cell array may depend on the maximum load current, for example. For example, a number of transistor cells of the transistor cell array may be larger than 100, or larger than 1000, or even larger than 10000, for example. The power transistor device may be further configured to block voltages between the load terminals, e.g. between emitter and collector of an IGBT or between drain and source of a MOSFET, of more than 10 V, 12 V, 60V, 100V, 400 V, 650V, 1.2 kV, 1.7 kV, 3.3 kV, 4.5 kV, 5.5 kV, 6 kV, 6.5 kV. The blocking voltage may correspond to a voltage class specified in a datasheet of the power transistor device, for example. The blocking voltage of the transistor device may be adjusted by an impurity concentration and/or a vertical extension of a drift region in the semiconductor body. A doping concentration of the drift region may gradually or in steps increase or decrease with increasing distance to the first main surface at least in portions of its vertical extension. According to other examples the impurity concentration in the drift region may be approximately uniform. For power transistors based on silicon, a mean impurity concentration in the drift region may be between $2 \times 10^{12}$ cm$^{-3}$ and $1 \times 10^{17}$ cm$^{-3}$, for example in a range from $5 \times 10^{12}$ cm$^{-3}$ to $1 \times 10^{15}$ cm$^{-3}$ or to $2 \times 10^{14}$ cm$^{-3}$. In some cases, the mean impurity concentration in the drift region for power transistors based on silicon may be in a range from $1 \times 10^{15}$ cm$^{-3}$ to $1 \times 10^{17}$ cm$^{-3}$. In the case of a power transistor device based on SiC, a mean impurity concentration in the drift region may be between $5 \times 10^{14}$ cm$^{-3}$ and $1 \times 10^{18}$ cm$^{-3}$, for example in a range from $1 \times 10^{15}$ cm$^{-3}$ to $1 \times 10^{17}$ cm$^{-3}$. A vertical extension of the drift region may depend on voltage blocking requirements, e.g. a specified voltage class, of the vertical power transistor device. When operating the vertical power transistor device in voltage blocking mode, a space charge region may vertically extend partly or totally through the drift region depending on the blocking voltage applied to the vertical power transistor device. When operating the vertical power transistor device at or close to the specified maximum blocking voltage, the space charge region may reach or penetrate into a field stop region that is configured to prevent the space charge region from further reaching to a drain contact or collector contact at the second main surface of the semiconductor body. For IGBTs, in this manner, the drift region may be formed using desired low doping levels and with a desired thickness while achieving soft switching.

For example, the trench electrode structure of the trench structure may be or may include a control electrode configured to control a conductivity of a transistor channel region by field-effect. In other words, the trench electrode structure may include a gate electrode. In addition the trench electrode structure may be configured to control an electric field distribution and parasitic capacitance. In other words, the trench electrode structure may include a so-called field electrode. For example, the gate electrode and the field electrode may be merged, or may be spaced from one another, e.g. along the vertical direction with the gate electrode being arranged between the first main surface and the field electrode.

For example, the gate dielectric of the trench dielectric structure may include or consist of a semiconductor oxide, for example thermally grown or deposited silicon oxide, semiconductor nitride, for example deposited or thermally grown silicon nitride, a semiconductor oxynitride, for example silicon oxynitride, or a combination thereof.

For example, the gap of the gate dielectric structure may include or consist of an insulating gaseous volume, a volume filled with liquid or a vacuum.

The gate dielectric may line at least part of sidewalls of the trench structure. The gate dielectric may be arranged between a channel region in the semiconductor body and the gate electrode. For example, the plurality of transistor cells may be formed as stripes extending in parallel along a first lateral direction, e.g. a longitudinal direction of the gate electrode.

For example, a ratio between a width of the gate electrode and a length of the gate electrode may range between 10 and $10^5$. The width may relate to an extension of the gate electrode along a second lateral direction that is perpendicular to the first lateral direction at a vertical level located at a center between the first main surface and a bottom side of the gate electrode. In other words, the width may be taken at half of a depth of the gate electrode with respect to the first main surface. The length may relate to an extension of the gate electrode along the first lateral direction. For example, the width ranges may range between 50 nm and 2 µm, or between 200 nm and 1 µm, or between 300 nm and 800 nm.

For example, the semiconductor device may include a drift region. The drift region may be configured for a breakdown voltage between the first load electrode and the second load electrode of greater than 12V or greater than 100V or greater than 500V or even greater than 1000V, e.g. by adjusting a thickness and/or vertical doping concentration profile in the drift region. For example, the drift region may be formed in a silicon semiconductor body. For example, the drift region may be formed in a silicon carbide semiconductor body.

The gap may allow for protecting the semiconductor device from damage or alteration of initial characteristics due to electric field strengths during reverse blocking operation of the semiconductor device or due to extreme stress events such as direct electrical breakdown or hot carrier injection. The gap may further allow for avoiding doped shielding regions below gate trenches. Such shielding regions are, for example, typically used in SiC devices for protecting gate dielectrics from high electric fields and are accompanied by an undesired JFET (junction field effect transistor) that may limit the area-specific on-state resistance when shrinking device dimensions.

Structural and functional details described with regard to features of the semiconductor device above may likewise apply to the corresponding features related to the examples below.

For example, an interface between the gap and the trench electrode structure may have one or more steps. A number and height of the one or more steps may be appropriately set such that the trench dielectric structure in the upper part, e.g. the gate dielectric, is protected from damage or alteration of initial characteristics due to electric field strengths during operation of the semiconductor device or due to extreme stress events such as direct electrical breakdown or hot carrier injection.

For example, an interface between the gap and the semiconductor body may have one or more steps. Similar to the interface between the gap and the trench electrode structure, a number and height of the one or more steps in the interface between the gap and the semiconductor body may be appropriately set such that the trench dielectric structure in the upper part, e.g. the gate dielectric, is protected from damage or alteration of initial characteristics due to electric field strengths during operation of the semiconductor device or due to extreme stress events such as direct electrical breakdown or hot carrier injection.

For example, a width of the gap at least in part tapers from a bottom side of the trench structure towards the gate dielectric. In a reverse blocking mode of the semiconductor device, this allows for transferring electric equipotential lines from inside the gap into the drift region, and thereby to counteract a concentration of electric equipotential lines at an interface between the gap and the gate dielectric. Thereby, the electric field strength at the interface between the gap and the gate dielectric may be reduced.

For example, the trench electrode structure may include a gate electrode adjoining the gate dielectric in the upper part of the trench dielectric structure. The trench structure may further include a field electrode adjoining the gap in the lower part of the trench dielectric structure. The trench dielectric structure may further include an intermediate dielectric between the gate electrode and the field electrode. The intermediate dielectric and the gate dielectric may be merged, for example.

For example, a top part of the gap may be laterally limited by the semiconductor body on one side and by the intermediate dielectric on the other side. Thus, an upper sidewall part of the gap may directly adjoin to the intermediate dielectric and a lower sidewall part of the gap may directly adjoin to the field electrode, for example. This may allow for transferring electric equipotential lines from the gap into the intermediate dielectric not only via a top side of the gap but also via the upper sidewall part. Thereby, the electric field distribution may be further improved.

For example, a thickness of the intermediate dielectric may be at least two times larger than a thickness of the gate dielectric. The thickness of the intermediate dielectric may be a vertical extent of the intermediate dielectric between the gate electrode and the field electrode. For example, the thickness may refer to the vertical distance between the gate electrode and the field electrode with respect to a center of the trench structure.

For example, the semiconductor device may further include a transition point between the gap and the intermediate dielectric at the sidewall to the semiconductor body. A first distance between the transition point and the gate electrode may be larger than a second distance between the transition point and the field electrode. The first distance and the second distance may also be equal or approximately equal. Electric equipotential lines penetrate through the intermediate dielectric between the transition point and the gate electrode. Likewise, electric equipotential lines penetrate through the intermediate dielectric between the transition point and the field electrode. Since the distribution of the equipotential lines may be set to a certain degree by a shape of the surface between the gap and the intermediate dielectric, a vertical distance between a top side of the field electrode and the transition point may be smaller than a vertical distance between a bottom side of the gate electrode and the transition point.

For example, a cross-sectional shape of the top part of the gap may be triangular, rectangular, or curved. The shape may be set depending on a desired distribution of electric equipotential lines at a reference blocking voltage of the semiconductor device, for example. The cross-sectional shape may refer to a sectional plane that is perpendicular to the first main surface and perpendicular to the sidewall between the trench structure and the semiconductor body, for example.

For example, the semiconductor device may further include a second field electrode and a second intermediate dielectric between the second field electrode and the field electrode. A side surface of the gap may directly adjoin the field electrode in an upper part and the second field electrode in the lower part of the gap. By separately processing the second field electrode and the field electrode, this may allow for a further degree of freedom when setting a shape of the side surface of the gap in view of a desired distribution of electric equipotential lines.

For example, the width of the gap at a center of the bottom side of the trench structure may range from (Vbd×nm)/(25× V) to (Vbd×nm)/(2×V), Vdb being an absolute maximum rated value of a drain to source breakdown voltage. The width of the gap may correspond to a vertical distance between the semiconductor body and the field electrode at the center of the bottom side of the trench structure, for example. The width of the gap at the bottom side may be set depending on the portion of the blocking voltage that is absorbed by the gap and another portion of the blocking voltage that is absorbed by the drift region.

For example, the gap may be configured to fix an electric breakdown between a drain to a source as a tunneling breakdown. For example, the electric field strength at an interface between the gap and the field electrode may be adjusted so that a leakage current, e.g. caused by Fowler-Nordheim tunneling, falls below a certain threshold value. The electric field strength may be smaller than a critical electric field strength for electric breakdown in the semiconductor body, e.g. approximately 2 MV/cm in SiC. Thus, a unipolar tunneling may define the electric breakdown instead of the material characteristics of the semiconductor body. As a consequence, a tunneling current characteristic may define a snapback current characteristic of the semiconductor device. This may allow for more robust semiconductor devices, for example.

For example, the gap may be filled with a gas having a pressure of less than 1 atm. The maximum width of the gap may range between 10 nm and 300 nm.

For example, the semiconductor device may be a power semiconductor device having an absolute maximum rated value of an electric breakdown voltage between a first load terminal and a second load terminal in a range from 100V to 6500V.

A further example of the present disclosure relates to a semiconductor device including a silicon carbide, SiC semiconductor body having a first main surface. The semiconductor device may include a trench structure extending into the SiC semiconductor body from the first main surface. The trench structure may include a gate electrode and a gate dielectric. The gate dielectric may be a gap arranged between the gate electrode and the SiC semiconductor body. The semiconductor device may further include a body region adjoining the gate dielectric at a sidewall of the trench structure.

For example, the gap may be filled with a gas having a pressure of less than 1 atm, and a maximum width of the gap ranges from 5 nm to 50 nm.

For example, the gap may line opposite sidewalls and a bottom side of the trench structure.

The examples and features described above and below may be combined.

Some of the above and below examples are described in connection with a silicon carbide substrate. Alternatively, a wide band gap semiconductor substrate, e.g. a wide band gap wafer, may be processed, e.g. comprising a wide band gap semiconductor material different from silicon carbide. The wide band gap semiconductor wafer may have a band gap larger than the band gap of silicon (1.1 eV). For example, the wide band gap semiconductor wafer may be a silicon carbide (SiC) wafer, or gallium arsenide (GaAs) wafer, or a gallium nitride (GaN) wafer. In some further examples, a silicon semiconductor substrate may be processed.

More details and aspects are mentioned in connection with the examples described above or below. The semiconductor device may comprise one or more optional additional features corresponding to one or more aspects mentioned in connection with the proposed concept or one or more examples described above or below.

The aspects and features mentioned and described together with one or more of the previously described examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, e.g. by expressions like "thereafter", for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Figure 2:
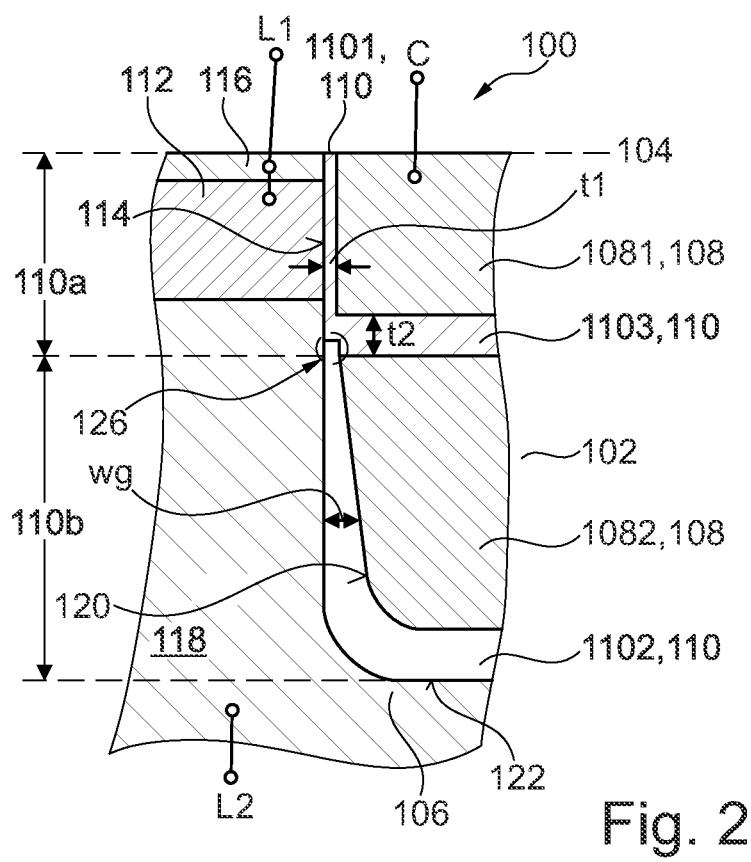
Figure 3:
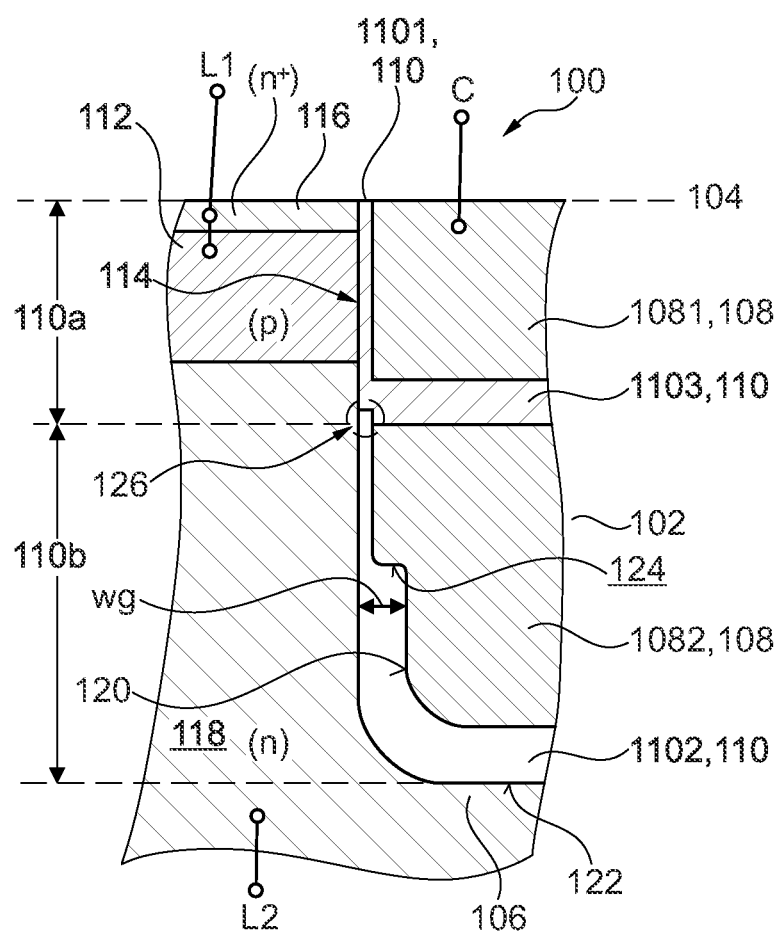

The schematic cross-sectional views of FIGS. 1 to 3 illustrate examples of semiconductor devices including a trench dielectric structure having a gate dielectric in an upper part and a gap in a lower part.

Referring to the schematic cross-sectional view of FIG. 1, a semiconductor device 100 includes a semiconductor body 102 having a first main surface 104.

A trench structure 106 extends into the semiconductor body 102 from the first main surface 104. The trench structure 106 includes a trench electrode structure 108 and a trench dielectric structure 110. The trench dielectric structure 110 includes a gate dielectric 1101 in an upper part 110a of the trench dielectric structure 110 and a gap 1102 in a lower part 110b of the trench dielectric structure 110. For example, the gate dielectric 1101 may include or consist of a thermally grown silicon oxide layer, a deposited silicon oxide layer, e.g. a silicon oxide based on TEOS (tetraethyl-orthosilicate), or both. The trench electrode structure 108 includes a gate electrode 1081 adjoining the gate dielectric 1101 in the upper part of the trench dielectric structure 110. The gate electrode 1081 of the trench electrode structure 108 is merged with a lower part of the trench electrode structure 108 that is configured as a field electrode and has a smaller width than the gate electrode 1081. Thus, a width wg of the gap 1102 tapers toward a transition point TP between the gap 1102 and the gate dielectric 1101. In the example illustrated in FIG. 1, the width wg of the gap 1102 is constant or almost constant along a predominant vertical extent of the gap 1102.

A p-doped body region 112 adjoins the gate dielectric 1101 at a sidewall 114 of the trench structure 106 in the upper part 110a of the trench dielectric structure 110. The gate dielectric 1101 extends deeper into the semiconductor body 102 along the sidewall 114 than the body region 112. Further, an n$^+$-doped source region 116 adjoins the gate dielectric 1101 at the sidewall 114 of the trench structure 106 in the upper part 110a. An n-doped drift region 118 adjoins the sidewall 114 in the lower part 110b of the trench dielectric structure 110. Vertical extension and dopant concentration in the drift region 118 are selected such that the semiconductor device 100 reaches its nominal blocking voltage capability.

The drift region 118 may be formed in a layer grown by epitaxy. For example, for a drift region 118 in SiC, a mean net dopant concentration may be in the range from $1.0 \times 10^{15}$ cm$^{-3}$ to $5.0 \times 10^{16}$ cm$^{-3}$. A vertical extension of the drift region 118 is related to the nominal blocking capability of the semiconductor device 100. The vertical extension of the drift region 118 may be in the range of about 1 μm to several 10 μm or in the range between 5 μm and 12 μm. In the semiconductor body 102, further doped regions may be arranged, for example barrier zones and/or current spread regions of the conductivity type of the drift region 118 or counter-doped regions. For example, each current spread region may directly adjoin or may be below the body region 112. A mean net dopant concentration in the current spread regions may be higher than in the drift region 118.

The source region 116 and the body region 112 are electrically connected to a first load electrode L1, e.g. a front side load electrode or front side load pad. The front side electrode is one example of a first load electrode L1. The first load electrode L1 is, for example, the source terminal in case the semiconductor device 100 is an IGFET, or an emitter terminal in case the semiconductor device 100 is an IGBT. A variety of contact schemes may be used to electrically connect the source region 112 and the body region 112 to the first load electrode L1, e.g. by groove contacts or by parts of a mesa along a longitudinal direction of the mesa where the body region 112 extends to the first main surface 104 for being electrically connected. These and further contact variations are illustrated in the cross-sectional views of FIGS. 1 to 3 in a simplified manner by contact nodes within the body region 112 and within the source region 116.

The drift region 118 is electrically coupled to a second load electrode L2, e.g. a rear side electrode, which may directly adjoin a second main surface opposite to the first main surface 104 (not illustrated in FIG. 1). The rear side electrode is one example of second load electrode L2, which may be the drain terminal in case the semiconductor device 100 is an IGFET, or a collector terminal in case the semiconductor device 100 is an IGBT.

The trench electrode 108 is electrically connected to a control electrode C, e.g. a front side control electrode or front side control pad. The front side control electrode is one example of a control electrode C.

In the example of the semiconductor device 100 illustrated in FIG. 2, the trench electrode structure 108 includes the gate electrode 1081 adjoining the gate dielectric 1101 in the upper part 110a of the trench dielectric structure 110. The trench electrode structure 108 further includes a field electrode 1082 adjoining the gap 1102 in the lower part 110b of the trench dielectric structure 110. The trench dielectric structure 110 further includes an intermediate dielectric 1103 between the gate electrode 1081 and the field electrode 1082. For example, a thickness t2 of the intermediate dielectric 1103 is at least two times larger than a thickness t1 of the gate dielectric 1101. For example, the intermediate dielectric 1083 may include or consist of a thermally grown silicon oxide layer, a deposited silicon oxide layer, e.g. a silicon oxide based on TEOS (tetraethyl-orthosilicate), or both.

A top part 126 of the gap 1102 is laterally limited by the semiconductor body 102 on one side and by the intermediate dielectric 1103 on the other side. The width wg of the gap 1102 continuously tapers from a bottom side 122 of the trench structure 106 towards the gate dielectric 1101. In the example illustrated in FIG. 2, tapering of the gap 1102 is predominantly caused by a taper angle of the field electrode 1082. An alternative or additional option for adjusting tapering of the gap 1102 is a taper angle of the sidewall 114 of the trench structure 106.

In the example of the semiconductor device 100 illustrated in FIG. 3, an interface 120 between the gap 1102 and the trench electrode structure 108 has a step 124 for adjusting tapering of the gap 1102.

The measures for adjusting tapering of the gap 1102 described above may be combined, i.e. taper of the sidewall 114 adjoining the gap 1102, taper of interface between the gap 1102 and the field electrode 1082, step in the sidewall 114 adjoining the gap 1102 and step in the interface between the gap 1102 and the field electrode 1082 may be combined in any way.

The semiconductor device 100 illustrated in FIGS. 1 to 3 may be an IGBT (insulated gate bipolar transistor), or an IGFET (insulated gate field effect transistor), for example, a MOSFET (metal oxide semiconductor FET).

The schematic cross-sectional views of FIGS. 4A and 4B are based on the examples of semiconductor devices illustrated in FIGS. 1 and 2, respectively, and further illustrate electric equipotential lines EPL during a reverse blocking mode of the semiconductor device 100. Transition of the electric equipotential lines into the drift region 118 may be improved by tapering the gap 1102 of the trench dielectric structure 110.

The schematic cross-sectional views of FIGS. 5A to 5D are based on a semiconductor device including the intermediate dielectric 1103 (see e.g. FIGS. 2, 3) and exemplify various shapes of the top part 126 of the gap 1102 for transferring electric equipotential lines EPL from the gap 1102 into the drift region 118 and into the intermediate dielectric 1103. The top part 126 of the gap 1102 in the illustrated examples has a cross-sectional shape in the form of a rectangle (see FIG. 5A), a semicircle (see FIG. 5B), a quarter circle (see FIG. 5C), and a triangle (see FIG. 5D). The shape of the top part 126 of the gap 1102 may be designed depending on process technology and aims at diverging the equipotential lines EPL from the gap 1102 into intermediate dielectric 1103 and the drift region 118 similar to a diverging lens in optics. A thickness t2 of the intermediate dielectric 1103 may be at least two times larger than a thickness t1 of the gate dielectric 1101. A transition point TP is located between the gap 1102 and the intermediate dielectric 1103 at the sidewall 114. In the illustrated examples, a first distance dt1 between the transition point TP and the gate electrode 1081 is larger than a second distance dt2 between the transition point TP and the field electrode 1082. The first distance dt1 may also be approximately equal to the second distance dt2, for example.

Another example of a semiconductor device 100 is illustrated in the schematic cross-sectional view of FIG. 6. Other than the semiconductor device 100 of FIGS. 2 and 3, the semiconductor device 100 of FIG. 6 further includes a second field electrode 1083 and a second intermediate dielectric 1104 between the second field electrode 1083 and the field electrode 1082. A part of the first load electrode L1 is a groove contact electrically connected to the source region 116 and the body region 112. A highly p-doped body contact region 1122 may be arranged between the groove contact and the body region 112 for improving an ohmic contact characteristic, for example. An interlayer dielectric 128 is arranged between the first load electrode L1 and the first main surface 104. Apart from one (see FIGS. 2, 3) or two (see FIG. 6) field electrodes in the trench structure 106, another number of field electrodes may be used. The field electrodes may be independently processed for achieving even more flexibility for adjusting shape and tapering the gap 1102, for example.

Figure 7:
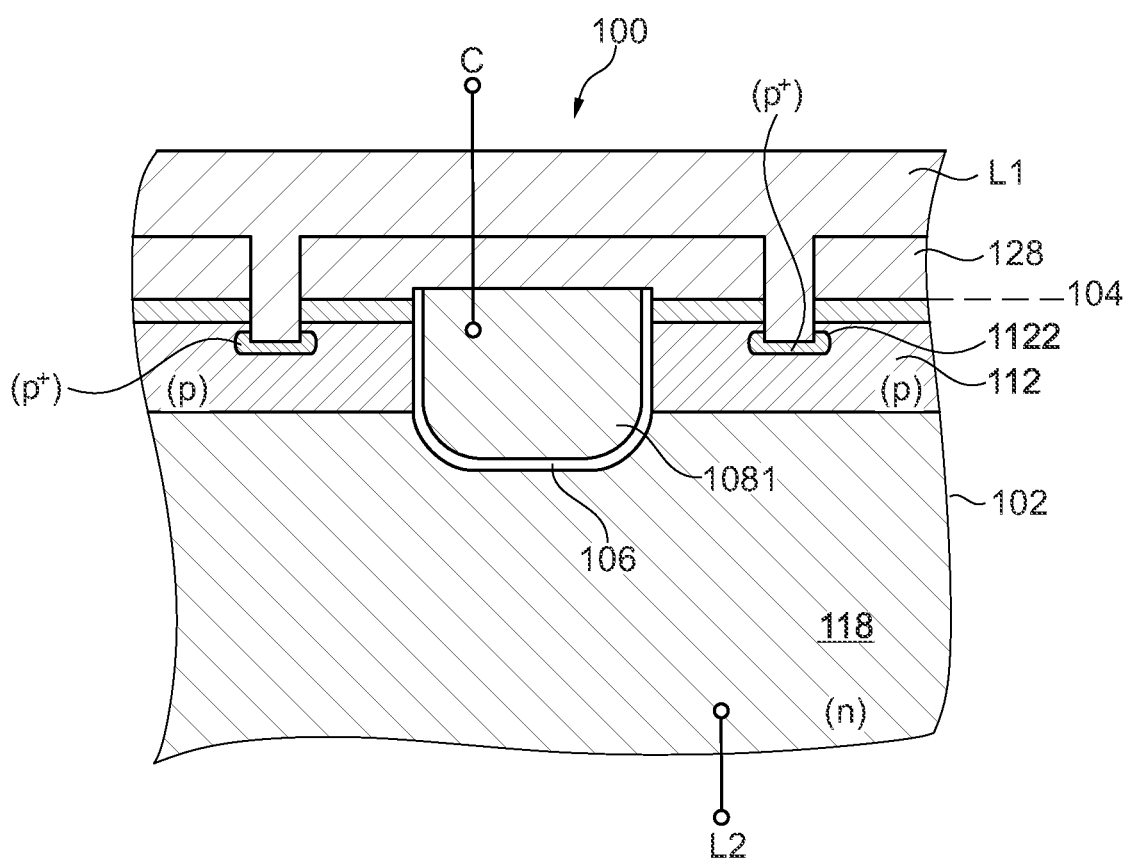

Another example of a semiconductor device 100 is illustrated in the schematic cross-sectional view of FIG. 7. The semiconductor device 100 includes a trench structure 106 extending into the semiconductor body 102 from the first main surface 104. The trench structure 106 includes a gate electrode 1081 and a gate dielectric 1101. The gate dielectric 1101 in the example of FIG. 7 is a gap arranged between the gate electrode 1081 and the semiconductor body 102. The gap may be filled with a gas having a pressure of less than 1 atm, and a maximum width of the gap may range from 5 nm to 50 nm, for example.

The above examples have been illustrated based on re-channel FET cells with p-doped body region 112, n-doped source region 116 and n-doped drift region 118. According to other examples, the transistor cells TC may be p-channel FET cells with n-doped body region 112, p-doped source region 116 and p-doped drift region 118.

The field electrodes 1082, 1083 described with reference to the figures above may be electrically connected to the first load electrode L1, to another terminal of the semiconductor device 100, to an output of an internal or external driver circuit, or may float. In case of multiple field electrodes per trench structure, the multiple field electrodes may be coupled to identical or different potentials.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

The aspects and features mentioned and described together with one or more of the previously detailed examples and figures, may as well be combined with one or more of the other examples in order to replace a like feature of the other example or in order to additionally introduce the feature to the other example.

What is claimed is:

1. A semiconductor device, comprising:
a semiconductor body having a first main surface;
a trench structure extending into the semiconductor body from the first main surface, wherein the trench structure includes a trench electrode structure and a trench dielectric structure, and the trench dielectric structure includes a gate dielectric in an upper part of the trench dielectric structure and a gap laterally extending from a sidewall of the trench structure to the trench electrode structure in a lower part of the trench dielectric structure; and
a body region adjoining the gate dielectric at the sidewall of the trench structure in the upper part of the trench dielectric structure, wherein the gate dielectric extends deeper into the semiconductor body along the sidewall of the trench structure than the body region,
wherein an interface between the gap and the trench electrode structure has one or more steps and/or wherein an interface between the gap and the semiconductor body comprises a step.

2. The semiconductor device of claim 1, wherein a width of the gap at least in part tapers from a bottom side of the trench structure towards the gate dielectric.

3. The semiconductor device of claim 1, wherein the trench electrode structure includes a gate electrode adjoining the gate dielectric in the upper part of the trench dielectric structure, and further includes a field electrode adjoining the gap in the lower part of the trench dielectric structure, and wherein the trench dielectric structure further includes an intermediate dielectric between the gate electrode and the field electrode.

4. The semiconductor device of claim 3, wherein a top part of the gap is laterally limited by the semiconductor body on one side and by the intermediate dielectric on the other side.

5. The semiconductor device of claim 4, wherein a cross-sectional shape of the top part of the gap is triangular, rectangular, or curved.

6. The semiconductor device of claim 3, wherein a thickness of the intermediate dielectric is at least two times larger than a thickness of the gate dielectric.

7. The semiconductor device of claim 6, wherein a cross-sectional shape of the top part of the gap is triangular, rectangular, or curved.

8. The semiconductor device of claim 3, further comprising a transition point between the gap and the intermediate dielectric at the sidewall of the trench structure, wherein a first distance between the transition point and the gate electrode is equal to or larger than a second distance between the transition point and the field electrode.

9. The semiconductor device of claim 8, wherein a cross-sectional shape of the top part of the gap is triangular, rectangular, or curved.

10. The semiconductor device of claim 3, further comprising a second field electrode and a second intermediate dielectric between the second field electrode and the field electrode.

11. The semiconductor device of claim 1, wherein the width of the gap at a center of the bottom side of the trench structure ranges from (Vbd×nm)/(25×V) to (Vbd×nm)/(2×V), where Vdb is an absolute maximum rated value of a drain to source breakdown voltage.

12. The semiconductor device of claim 1, wherein the gap is configured to fix an electric breakdown between a drain to a source as a tunneling breakdown.

13. The semiconductor device of claim 1, wherein the gap is filled with a gas having a pressure of less than 1atm, and wherein a maximum width of the gap ranges between 10 nm and 300 nm.

14. The semiconductor device of claim 1, wherein the semiconductor device is a power semiconductor device having an absolute maximum rated value of an electric breakdown voltage between a first load terminal and a second load terminal in a range from 100V to 6500V.

15. A semiconductor device, comprising:
a semiconductor body having a first main surface;
a trench structure extending into the semiconductor body from the first main surface, wherein the trench structure includes a trench electrode structure and a trench dielectric structure, and the trench dielectric structure includes a gate dielectric in an upper part of the trench dielectric structure and a gap laterally extending from a sidewall of the trench structure to the trench electrode structure in a lower part of the trench dielectric structure; and
a body region adjoining the gate dielectric at the sidewall of the trench structure in the upper part of the trench dielectric structure, wherein the gate dielectric extends deeper into the semiconductor body along the sidewall of the trench structure than the body region,
wherein the trench electrode structure includes a gate electrode adjoining the gate dielectric in the upper part of the trench dielectric structure, and further includes a field electrode adjoining the gap in the lower part of the trench dielectric structure, and wherein the trench dielectric structure further includes an intermediate dielectric between the gate electrode and the field electrode, and
wherein a top part of the gap is laterally limited by the semiconductor body on one side and by the intermediate dielectric on the other side.

* * * * *